(12) United States Patent
Guo et al.

(10) Patent No.: US 7,015,766 B1
(45) Date of Patent: Mar. 21, 2006

(54) CMOS VOLTAGE-CONTROLLED OSCILLATOR (VCO) WITH A CURRENT-ADAPTIVE RESISTOR FOR IMPROVED LINEARITY

(75) Inventors: Zhangqi Guo, San Jose, CA (US); Michael Y. Zhang, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 23 days.

(21) Appl. No.: 10/710,657

(22) Filed: Jul. 27, 2004

(51) Int. Cl.
*H03B 5/04* (2006.01)
*H03B 5/24* (2006.01)

(52) U.S. Cl. .................. 331/176; 331/57; 331/185; 331/186

(58) Field of Classification Search ............ 331/8, 331/17, 57, 177 R, 175, 176, 185, 186
See application file for complete search history.

(56) References Cited

U.S. PATENT DOCUMENTS

| | | | |
|---|---|---|---|
| 4,531,155 A | 7/1985 | Hasegawa | 348/724 |
| 5,418,497 A | 5/1995 | Martin | 331/48 |
| 5,544,120 A | 8/1996 | Kuwagata et al. | 365/222 |
| 5,767,748 A | 6/1998 | Nakao | 331/57 |
| 6,281,727 B1 | 8/2001 | Hattori | 327/156 |
| 6,424,585 B1 | 7/2002 | Ooishi | 365/226 |
| 6,469,585 B1 | 10/2002 | Dai et al. | 331/57 |
| 6,525,613 B1 * | 2/2003 | Cyrusian | 331/17 |
| 6,535,071 B1 | 3/2003 | Forbes | 331/57 |

* cited by examiner

*Primary Examiner*—David Mis
(74) *Attorney, Agent, or Firm*—Stuart T. Auvinen

(57) ABSTRACT

A voltage-controlled oscillator (VCO) for a phase-locked loop (PLL) has improved bandwidth and performance at lower frequency. A variable current source supplies a current to an internal oscillator-power node. The current varies with the VCO input voltage. The internal oscillator-power node drives the sources of p-channel transistors in inverter stages in the ring oscillator. The variable current causes the internal oscillator-power node's voltage to vary, which varies the output frequency. An active resistor is in parallel with the ring oscillator. The active resistor has a resistor and an n-channel transistor in series between the oscillator-power node and ground. The n-channel transistor has a fixed bias voltage on its gate and is non-linear. The non-linear effective resistance of the n-channel transistor improves overall linearity of the ring oscillator. The parallel effective resistance of the active resistor lowers overall effective resistance of the ring oscillator. Oscillator bandwidth at lower frequencies improves.

20 Claims, 4 Drawing Sheets

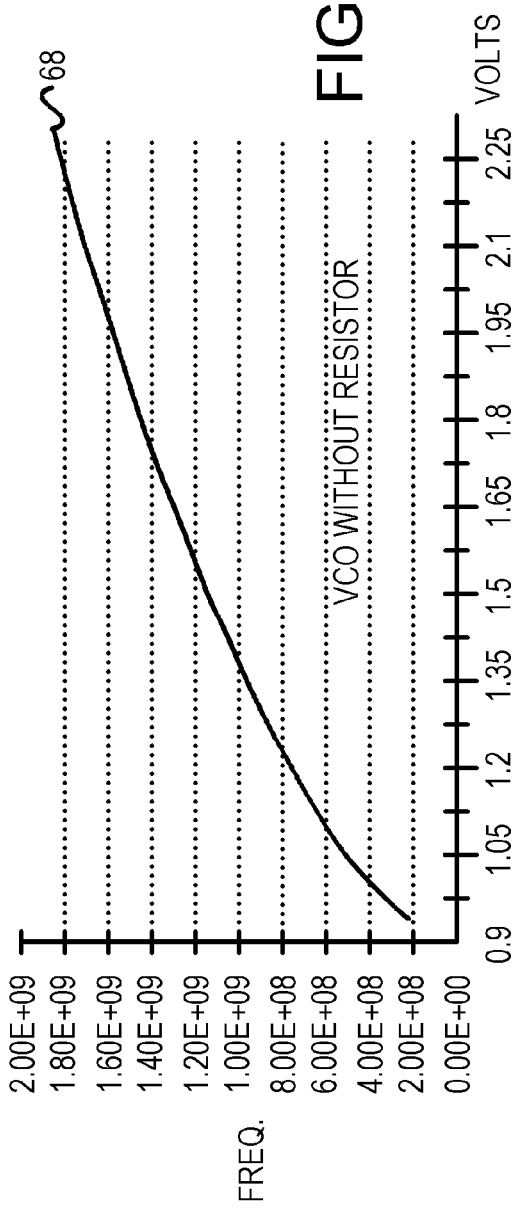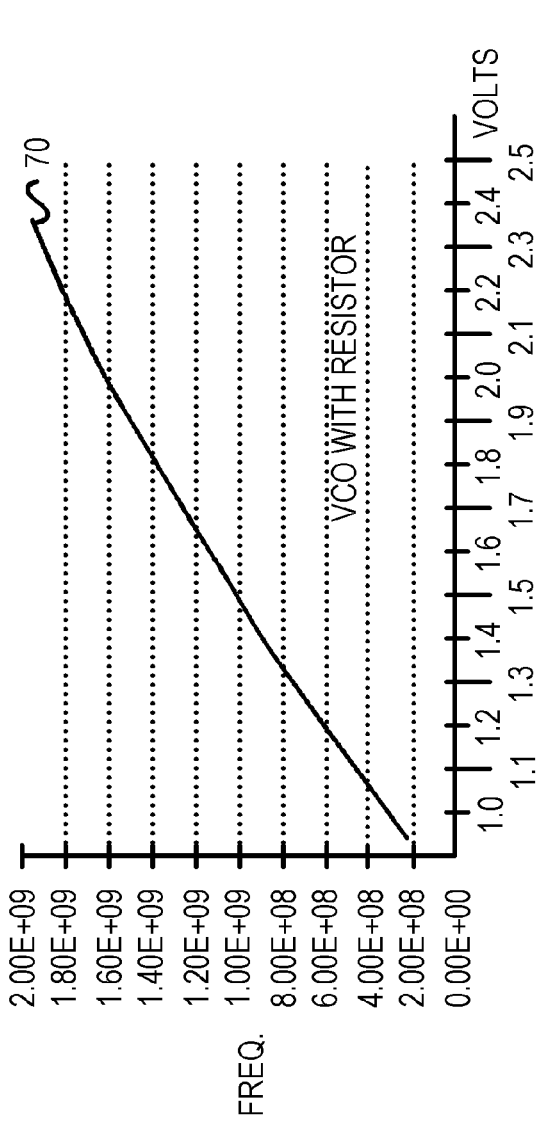

CMOS VOLTAGE-CONTROLLED OSCILLATOR (VCO) WITH A CURRENT-ADAPTIVE RESISTOR FOR IMPROVED LINEARITY

BACKGROUND OF INVENTION

This invention relates to voltage-controlled oscillators (VCOs), and more particularly for VCO with a current-adaptive resistor.

Precise clocks are useful in many electronic systems. Clock generator circuits can be adjustable, such as by using a voltage-controlled oscillator (VCO). The frequency of the generated clock can be adjusted by adjusting the voltage that is input to the VCO. Oftentimes the VCO is part of a phase-locked loop (PLL).

FIG. 1 shows a prior-art PLL. A reference clock and a feedback clock are applied to phase detector 10, which compares the edges of the 2 clocks and generates UP and DOWN signals to charge pump 12. Charge pump 12 responds by charging or discharging a loop filter that includes capacitor 22 and resistor 20. The voltage across the loop filter changes, altering the voltage input to VCO 14. VCO 14 oscillates at a frequency determined by the input voltage from the loop filter.

Clock driver 16 buffers the output clock from VCO 14 to generate the PLL output clock. The generated clock can be divided by divider 18 before being applied to phase detector 10 as the feedback clock.

A VCO is commonly used in PLL control systems, including communications, and timing circuitry. Some applications need a wide VCO frequency range with good linearity and high bandwidth.

One conventional construction for a VCO includes a first portion which converts an input voltage to a control current, and a second portion which converts the control current into an output signal using a ring oscillator. Conventionally the first portion of the VCO is designed to have a linear response in order to effect a linear VCO input/output response. However, this linear control current does not take into account a non-linear current-to-frequency response of the second portion, the ring oscillator.

In order to reduce power line noise, the conventional construction for a VCO includes a capacitance between a ring oscillator current-supply node and GND. VCO bandwidth is limited by this capacitance and the effective resistance of the ring oscillator.

The good linearity and high bandwidth of VCO directly influences the PLL's performance such as reference clock range.

Many different types of circuits can be used as the VCO. A ring oscillator can be used, and its oscillation frequency changed by adjusting the power-supply voltage applied to the oscillator's gates. A VCO using a current-adaptive resistor is desirable.

BRIEF DESCRIPTION OF DRAWINGS

FIG. 3A shows frequency response of a prior-art VCO.

FIG. 3B shows frequency response of the VCO with the active resistor.

DETAILED DESCRIPTION

The present invention relates to an improvement in voltage-controlled oscillators (VCOs). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
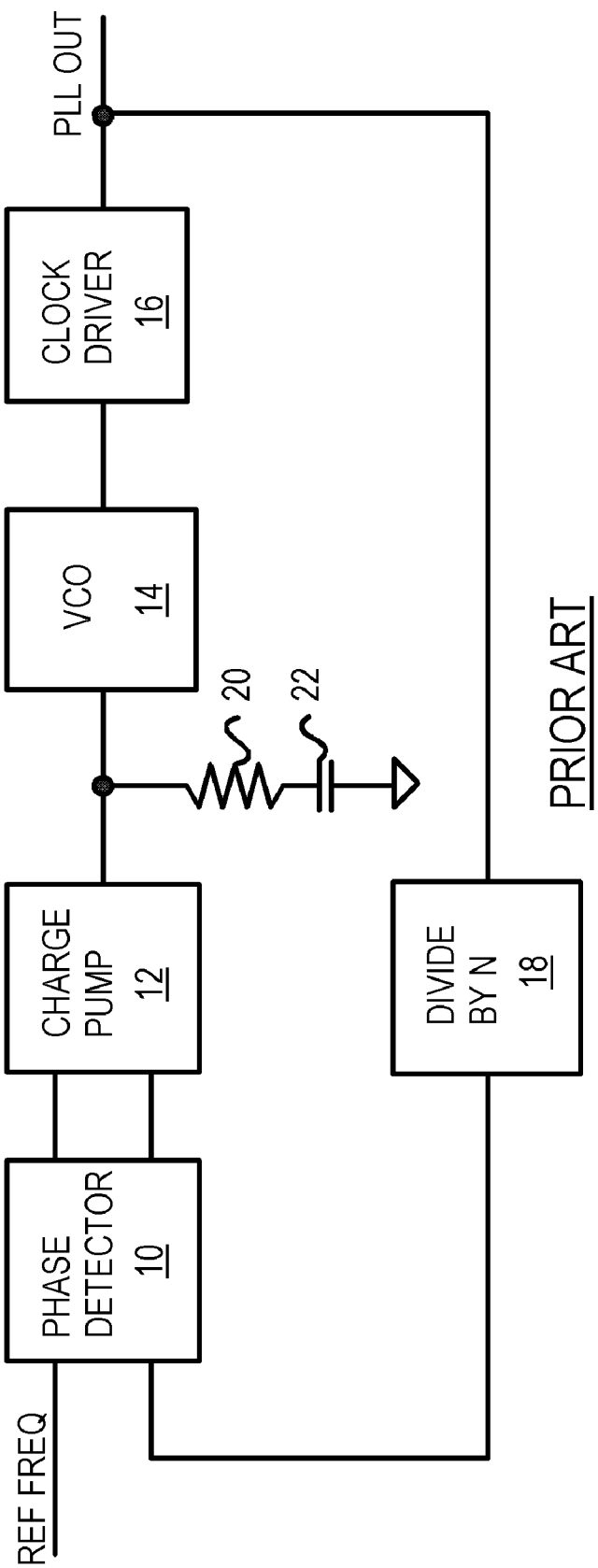
FIG. 1 shows a prior-art PLL.
Figure 2:
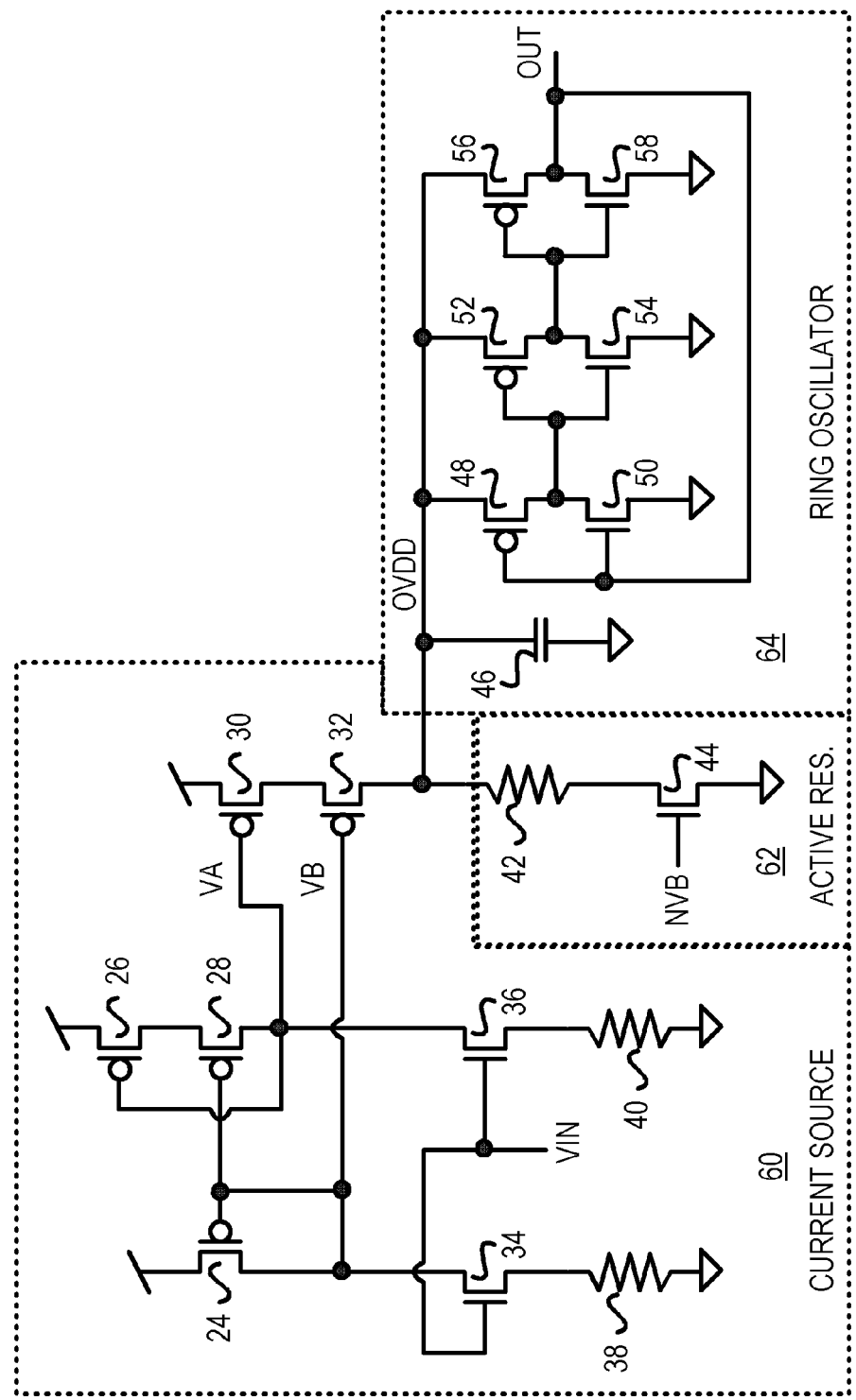
FIG. 2 is a schematic diagram of a VCO with a current-adaptive resistor.

FIG. 2 is a schematic diagram of a VCO with a current-adaptive resistor. Current source 60 receives the loop-filter voltage VIN which adjusts as a charge pump charges and discharges a loop filter capacitor in a PLL. The current delivered to the oscillator power-supply OVDD varies with VIN. A higher VIN produces more current from current source 60, raising OVDD. A higher OVDD causes more current to flow in ring oscillator 64, increasing its frequency of operation. OVDD acts as a virtual or internal power-supply to ring oscillator 64.

Active resistor 62 draws off some of the current from current source 60. This helps to regulate changes in current flow. The frequency gain of a VCO decreases when VIN increases if the current flowing to the ring oscillator is linear. Active resistor 62 can draw a larger current at low VIN and a smaller current at high VIN. This helps the ring oscillator to get more current at high VIN, adjusting for the non-linear current-to-frequency response of a typical ring oscillator. The source current $I_S$ from current source 60 is split into 2 parallel branches to ground: ring-oscillator current $I_O$ through ring oscillator 64 and resistor current $I_R$ through active resistor 62.

Since active resistor 62 has both series resistor 42 and series transistor 44 in series, its resistance is not exactly linear, as would be the case for a pure resistor. Instead, series transistor 44 has a transconductance that varies with its drain-to-source voltage. The gate of n-channel series transistor 44 is connected to a fixed bias voltage, NVB, which can be VDD/2 or some other value that can be generated by a voltage divider or other circuit. In one embodiment, NVB can be 1.78 v, series resistor 42 is 1.5 K-ohm, power (VDD) is 3.3 V, and OVDD can vary from 0.8 v to 2.4 v, depending on the VIN control voltage.

When the drain voltage of series transistor 44 is less than NVB-Vtn, series transistor 44 operates in the linear region. Vtn is the threshold voltage of series transistor, and can be 0.5 volts for some processes. When the drain voltage rises above NVB-Vtn, series transistor 44 operates in the saturated region and the current-voltage characteristic of series transistor 44 becomes more non-linear. Thus for higher source currents, which produce higher OVDD, active resistor 62 becomes less linear. This non-linearity at higher OVDD helps to compensate for high-frequency non-linearity of ring oscillator 64. The effective resistance of active resistor 62 increases in the saturated region for higher values of voltage OVDD. This causes a larger fraction of the current to pass through ring oscillator 64 relative to the current through active resistor 62.

Bypass capacitor 46 is connected between OVDD and ground. Bypass capacitor 46 reduces noise on OVDD, providing a more constant output from the VCO.

Ring oscillator 64 has an odd number of inverter stages in a loop. The first inverter stage of p-channel transistor 48 and n-channel transistor 50 have drains driving the gates of second-stage transistors 52, 54, which in turn drive the gates of third-stage transistors 56, 58. The drain output of transistors 56, 58 are looped back to the gate input of first-stage transistors 48, 50. The variable-frequency clock output, OUT, is taken from the drains of third-stage transistors 56, 58. Further buffering can be performed on the output signal.

Current source 60 has p-channel power transistors 30, 32 with channels in series between the power supply VDD and the oscillator power supply OVDD.

The gate voltage for lower power transistor 32 is VB, and is generated by the gate and drain of p-channel bias transistor 24, which has its gate and drain connected together. Variable n-channel transistor 34 receives the VCO input voltage VIN, that varies as the loop filter is charged and discharged in the PLL. Tail resistor 38 is connected to the source of variable n-channel transistor 34, while the drain of transistors 24, 34 are connected together as voltage VB. As VIN rises, variable n-channel transistor 34 draws more current, increasing the current pulled through p-channel bias transistor 24, requiring that the gate voltage VB fall. The lower VB increases the source current through power transistor 32, raising OVDD and increasing the frequency of OUT.

The gate voltage for upper power transistor 30 is VA, which is generated by the drain of p-channel lower bias transistor 28, which receives VB as its gate voltage. The drain of p-channel lower bias transistor 28 is upper bias voltage VA, which is also applied to the gate of p-channel upper bias transistor 26, which is in series with p-channel lower bias transistor 28 between power and VA.

Variable n-channel transistor 36 also receives the VCO input voltage VIN, that varies as the loop filter is charged and discharged in the PLL. Tail resistor 40 is connected to the source of variable n-channel transistor 36, while the drain of transistors 28, 36 are connected together as upper bias voltage VA.

As VIN rises, variable n-channel transistor 36 draws more current, increasing the current pulled through p-channel bias transistors 26, 26, requiring that the gate voltages VA, VB fall. The lower VA, VB increase the source current through power transistor 32, raising OVDD and increasing the frequency of OUT.

FIG. 3A shows frequency response of a prior-art VCO. The prior-art VCO does not have active resistor 62. As the VCO-input voltage VIN is swept from 0.9 to 2.25 volts, curve 68 shows the output frequency of the VCO output. The frequency rises from 200 MHz to almost 2 GHz.

However, the shape of curve 68 is not a straight line. Instead, frequency rises more rapidly at lower input voltages, while at higher VIN voltages curve 68 flattens out. This curvature of the FREQ-V curve is undesirable. A PLL using this VCO with the response of curve 68 would be somewhat non-linear in response.

FIG. 3B shows frequency response of the VCO with the active resistor. The VCO of FIG. 2 has active resistor 62. As the VCO-input voltage VIN is swept from 0.9 to 2.4 volts, curve 70 shows the output frequency of the VCO output. The frequency rises from 200 MHz to almost 2 GHz.

Figure 4:
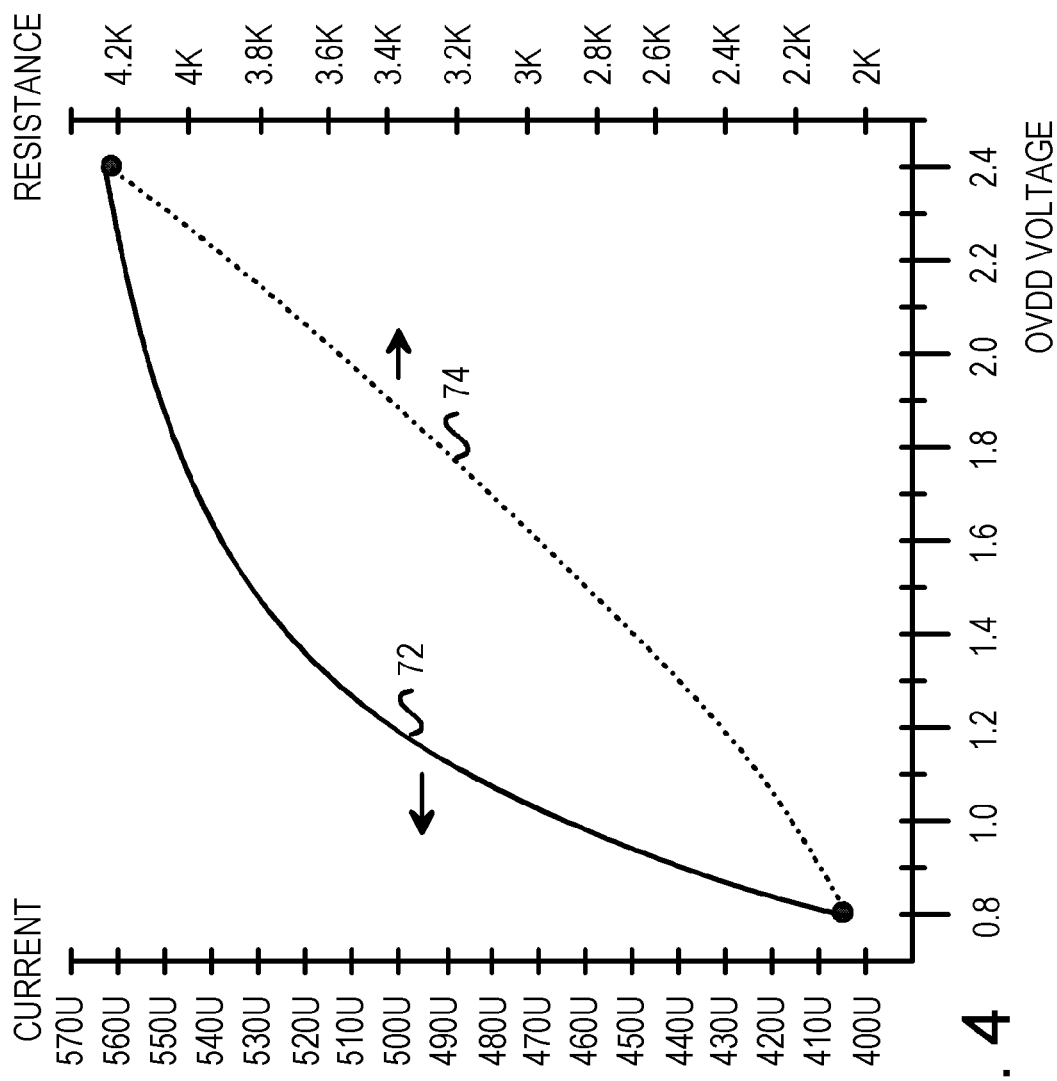
FIG. 4 is a graph of current through the active resistor and its effective resistance.

Curve 70 is more straight and linear than prior-art curve 68 of FIG. 3A. The more linear FREQ-V curve 70 allows for a PLL to be constructed that has a steady performance over a wide range of reference-clock frequencies. A linear VCO with a large tuning range enables the PLL system to remain stable, and performance is more independent from input frequency, making the PLL more robust FIG. 4 is a graph of current through the active resistor and its effective resistance. The current through active resistor 62 of FIG. 2 is not linear as would be the case for a true resistor. Instead, as the voltage OVDD increases from 0.8 to 2.4 volts, the active-resistor current $I_R$ rises sharply initially from 0.8 up to about 1.2 volts. Then the current rises less rapidly from 1.2 volts to 2.4 volts (VDD). Curve 72 shows that this current rises from about 400 $\mu$A to 560 $\mu$A.

The effective resistance, curve 74, rises from about 2 K-ohm to 4.2 K-Ohm over this range. The effective resistance is voltage divided by current, or OVDD/$I_R$. The effective resistance rises with OVDD because of the non-linearity of series transistor 44 in active resistor 62, especially as it enters the saturated region of operation above NVB-Vtn. Noise current from operation of ring oscillator 64 can be shunted through active resistor 62 as well as bypassed by bypass capacitor 46.

The effective resistance of ring oscillator 64 also varies with OVDD and frequency. At low OVDD and low frequency, the effective resistance of ring oscillator 64 is about 4.5 K-ohms, while at higher OVDD and higher frequency the effective resistance of ring oscillator 64 falls to 0.6 K-ohm.

The relatively high effective resistance of ring oscillator 64 at low frequency can limit its bandwidth. Bandwidth is limited by the R-C delay of the parallel effective resistances of active resistor 62 and ring oscillator 64, and by the fixed capacitance of bypass capacitor 46. Reducing the effective parallel resistance can reduce the R-C time-constant delay, improving bandwidth.

However, since active resistor 62 is in parallel with ring oscillator 64, the total resistance is the parallel combination. At low OVDD, ring oscillator 64 has an effective resistance of 4.5 K-ohm and active resistor 62 has an effective resistance of 2 K-ohm, so the parallel resistance is 4.5 K//2 K or 1.4 K-ohm. This is much less than the 4.5 K-ohm of ring oscillator 64 without active resistor 62. Thus low-frequency performance and bandwidth is improved by adding active resistor 62 in parallel.

At higher OVDD, ring oscillator 64 has an effective resistance of 0.6 K-ohm and active resistor 62 has an effective resistance of 4.2 K-ohm, so the parallel resistance is 0.6 K//4.2 K or 0.5 K-ohm. Overall bandwidth of ring oscillator 64 is thus improved.

ALTERNATE EMBODIMENTS

Several other embodiments are contemplated by the inventors. For example, for active resister 62, bias voltage NVB can be connected to a variable voltage to VIN or to OVDD. Rather than use inverters in ring oscillator 64, other kinds of gates such as a NAND gates could be used or could be inserted for resetting. R-C delays could also be added. More than three inverter stages could be used. Other arrangements and circuits for the current source could be used, and additional devices added such as additional capacitors, resistors, and transistors. Inverters or buffers could be added to the output or to other locations. Various clock drivers could be used. The clock driver could be located after the feedback to the divider.

Rather than use a current source from power and an active resistor to ground, p-channel and n-channel devices and power and ground could be reversed. Other current-diverting arrangements could be substituted.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A voltage-controlled oscillator (VCO) comprising:
   an output clock having an output frequency;
   an input having an input voltage that is varied to vary output frequency;
   a variable current source, responsive to the input, for varying a current to a source node in response to the input voltage;
   a ring oscillator that generates the output clock, the ring oscillator having the source node supplying current to transistors in the ring oscillator wherein varying a source voltage of the source node varies the output frequency of the output clock generated by the ring oscillator;
   a bypass capacitor coupled to the source node; and
   an active resistor coupled in parallel with the ring oscillator to the source node, the active resistor having a series resistor and a series transistor in series, whereby the active resistor in parallel with the ring oscillator lowers an R-C time constant of the source node.

2. The voltage-controlled oscillator of claim 1 wherein the series transistor has a gate driven by a constant bias voltage.

3. The voltage-controlled oscillator of claim 2 wherein the ring oscillator comprises a plurality of inverting stages, each inverting stage having a p-channel pull-up and an n-channel pull-down transistor having drains driving an input to a next stage in the plurality of inverting stages.

4. The voltage-controlled oscillator of claim 3 wherein the plurality of inverting stages comprises exactly 3 stages in a loop.

5. The voltage-controlled oscillator of claim 3 wherein the source node is connected to sources of p-channel pull-up transistors in the plurality of inverting stages.

6. The voltage-controlled oscillator of claim 5 wherein the active resistor is connected between the source node and a ground.

7. The voltage-controlled oscillator of claim 6 wherein the series transistor is an n-channel transistor.

8. The voltage-controlled oscillator of claim 7 wherein the variable current source is coupled between a power supply and the source node;
   wherein the source node is a virtual power-supply node to the ring oscillator.

9. The voltage-controlled oscillator of claim 8 wherein the variable current source comprises:
   a first current-bias transistor having a gate and a drain connected together at a first bias node, and a source connected to a power supply;
   a first input transistor having a drain connected to the first bias node, and a gate receiving the input with the input voltage that varies; and
   a first current-source transistor, having a gate receiving the first bias node, for varying current delivered to the source node in response to the first bias node.

10. The voltage-controlled oscillator of claim 9 wherein the variable current source further comprises:
    a second current-bias transistor having a gate connected to a second bias node, a drain connected to an intermediate node, and a source connected to the power supply;
    a third current-bias transistor having a gate receiving the first bias node and a drain connected to the second bias node, and a source connected to the intermediate node;
    a second input transistor having a drain connected to the second bias node, and a gate receiving the input with the input voltage that varies; and
    a second current-source transistor, having a gate receiving the second bias node, for varying current delivered to the source node in response to the second bias node.

11. The voltage-controlled oscillator of claim 10 wherein the first and second current-source transistors have channels in series between the power supply and the source node.

12. The voltage-controlled oscillator of claim 11 wherein the first, second, and third current-bias transistors and the first and second current-source transistors are p-channel transistors;
    wherein the first and second input transistors are n-channel transistors.

13. The voltage-controlled oscillator of claim 8 wherein the input is generated by a loop filter capacitor that is charged and discharged by a charge pump in response to a phase comparator in a phase-locked loops (PLL).

14. A linearized voltage-controlled oscillator (VCO) comprising:
    a VCO input having a varying voltage;
    ring oscillator means, having an odd number of inverting stages arranged in a loop, for generating an output clock derived from an output of one of the inverting stages, the output clock having an output frequency that varies with the VCO input in a substantially linear manner;
    internal power means for powering the ring oscillator means, the internal power means not directly connected to a power supply;
    wherein the inverting stages have pull-up transistors with power-supply connections to the internal power means and pull-down transistors with connections to a ground;
    bypass capacitor means, coupled between the internal power means and the ground, for suppressing rapid voltage changes to the internal power means;
    variable current source means for driving a varying current to the internal power means, the variable current source means varying the varying current in response to the varying voltage on the VCO input; and
    linearizing circuit means, coupled between the internal power means and the ground, for improving linearity of output frequency as a function of the VCO input, the linearizing circuit means having a series resistor and a series transistor having a channel in series with the series resistor between the internal power means and the ground;
    wherein the series transistor has a gate that receives a fixed voltage that does not vary with the VCO input;

whereby the variable current source means supplies current in parallel to the pull-up transistors in the ring oscillator means and to the linearizing circuit means.

15. The linearized voltage-controlled oscillator of claim 14 wherein the linearizing circuit means has a lower effective resistance at lower voltages of the internal power means than at higher voltages of the internal power means.

16. The linearized voltage-controlled oscillator of claim 15 wherein the ring oscillator means has a higher effective resistance at lower voltages of the internal power means than at higher voltages of the internal power means;

wherein the linearizing circuit means compensates for the ring oscillator means.

17. A high-bandwidth voltage-controlled oscillator (VCO) comprising:

a VCO input;

a variable current source driving a variable current onto an internal supply node, the variable current varying in response to the VCO input;

a ring oscillator having a plurality of inverters in a loop, each inverter having a p-channel transistor and an n-channel transistor with gates connected together an to an output of a preceding inverter in the loop, and having drains connected together and driving gates of a following inverter in the loop, the p-channel transistor having a source connected to the internal supply node and the n-channel transistor having a source connected to a ground;

a bypass capacitor coupled between the internal supply node and the ground; and a compensating circuit connected between the internal supply node and the ground, the compensating circuit having a resistor and a compensating transistor in series, the compensating transistor having a gate receiving a fixed voltage that does not vary with the VCO input, and a channel in series with the resistor, wherein the compensating circuit has an equivalent compensating resistance that is not constant but increases with an increasing voltage on the internal supply node.

18. The high-bandwidth voltage-controlled oscillator of claim 17 wherein the ring oscillator has an equivalent oscillator resistance that is not constant but decreases with an increasing voltage on the internal supply node;

wherein the compensating circuit compensates for changes in the equivalent oscillator resistance of the ring oscillator to produce a more linear frequency to VCO voltage curve than for the ring oscillator without the compensating circuit.

19. The high-bandwidth voltage-controlled oscillator of claim 18 wherein the compensating transistor is an n-channel transistor with a source connected to the ground and a drain connected to a first terminal of the resistor;

wherein the resistor has a second terminal connected to the internal supply node.

20. The high-bandwidth voltage-controlled oscillator of claim 19 wherein the variable current source comprises:

a first p-channel source transistor having a gate connected to a first bias node, a source connected to a power supply, and a drain connected to a first intermediate node;

a second p-channel source transistor having a gate connected to a second bias node, a source connected to the first intermediate node, and a drain connected to the internal supply node;

a first p-channel bias transistor having a gate connected to the second bias node, a drain connected to the second bias node, and a source connected to the power supply;

a first n-channel input transistor having a gate connected to the VCO input, a drain connected to the second bias node, and a source connected to the ground or through a first source resistor to the ground;

a second n-channel input transistor having a gate connected to the VCO input, a drain connected to the first bias node, and a source connected to the ground or through a second source resistor to the ground;

a second p-channel bias transistor having a gate connected to the first bias node, a drain connected to a second intermediate node, and a source connected to the power supply;

a third p-channel bias transistor having a gate connected to the second bias node, a drain connected to the first bias node, and a source connected to the second intermediate node.

* * * * *